United States Patent
Yoshida et al.

(10) Patent No.: US 10,136,514 B2
(45) Date of Patent: Nov. 20, 2018

(54) EXTENSIBLE FLEXIBLE PRINTED CIRCUIT BOARD AND METHOD FOR MANUFACTURING EXTENSIBLE FLEXIBLE PRINTED CIRCUIT BOARD

(71) Applicant: NIPPON MEKTRON, LTD., Minato-ku, Tokyo (JP)

(72) Inventors: Akio Yoshida, Tokyo (JP); Kiyoshi Igarashi, Tokyo (JP); Shingo Muromoto, Tokyo (JP); Taisuke Kimura, Tokyo (JP); Nobuyuki Shintaku, Tokyo (JP)

(73) Assignee: NIPPON MEKTRON, LTD., Tokyo (JP)

( * ) Notice: Subject to any disclaimer, the term of this patent is extended or adjusted under 35 U.S.C. 154(b) by 0 days.

(21) Appl. No.: 15/503,560

(22) PCT Filed: Apr. 6, 2015

(86) PCT No.: PCT/JP2015/060780
§ 371 (c)(1),
(2) Date: Feb. 13, 2017

(87) PCT Pub. No.: WO2016/024415
PCT Pub. Date: Feb. 18, 2016

(65) Prior Publication Data
US 2017/0231082 A1    Aug. 10, 2017

(30) Foreign Application Priority Data

Aug. 12, 2014  (JP) .................................. 2014-164114

(51) Int. Cl.
*H05K 1/02*   (2006.01)
*H05K 1/11*   (2006.01)
*H05K 3/28*   (2006.01)
*H05K 3/00*   (2006.01)
(Continued)

(52) U.S. Cl.
CPC .......... *H05K 1/028* (2013.01); *H05K 1/0278* (2013.01); *H05K 1/0283* (2013.01); *H05K 1/118* (2013.01);
(Continued)

(58) Field of Classification Search
CPC ............ H05K 1/028; H05K 3/46; H05K 3/28; H05K 1/0278; H05K 1/118; H05K 3/0026; H05K 2203/107; H05K 2203/1327
See application file for complete search history.

(56) References Cited

U.S. PATENT DOCUMENTS 5,219,640 A    6/1993  Gazit et al.
5,516,989 A *  5/1996  Uedo ................ H05K 1/028
                                              174/250
(Continued)

FOREIGN PATENT DOCUMENTS

JP    H0629667 A    2/1994
JP    H07164531 A   6/1995
(Continued)

OTHER PUBLICATIONS

International Search Report corresponding to Application No. PCT/JP2015/060780; dated Jun. 9, 2015, with English translation.
(Continued)

*Primary Examiner* — Ishwarbhai B Patel
(74) *Attorney, Agent, or Firm* — Cantor Colburn LLP

(57) ABSTRACT

An extensible flexible printed circuit board sets one or a plurality of flexible printed circuit boards each including a plurality of conductive layers and an insulating layer as a base circuit board, and includes: component mounting parts which are provided at least at parts of the base circuit board, and capable of mounting electronic components; an extensible conductive part which is provided at least at a part of the base circuit board, includes a plurality of joint parts each (Continued)

intersecting a center line in an extension/contraction direction and a plurality of curved parts each continuing from an end part of each joint part and curve, and exhibits extensibility by the curved parts curving to open or close; and a covering member whose material is a flexibly deformable elastomer, and which covers the component mounting parts and the extensible conductive part.

5 Claims, 10 Drawing Sheets

(51) Int. Cl.
    *H05K 3/46*         (2006.01)
    *H05K 1/03*         (2006.01)
    *H05K 1/18*         (2006.01)

(52) U.S. Cl.
    CPC ............ *H05K 3/0026* (2013.01); *H05K 3/28* (2013.01); *H05K 3/46* (2013.01); *H05K 1/0393* (2013.01); *H05K 1/18* (2013.01); *H05K 2201/05* (2013.01); *H05K 2203/107* (2013.01); *H05K 2203/1327* (2013.01)

(56) References Cited

U.S. PATENT DOCUMENTS

| | | |
|---|---|---|
| 2004/0238819 A1 | 12/2004 | Maghribi et al. |
| 2004/0243204 A1 | 12/2004 | Maghribi et al. |
| 2009/0317639 A1* | 12/2009 | Axisa .................... B32B 37/185 428/411.1 |
| 2011/0065319 A1 | 3/2011 | Oster et al. |
| 2011/0272181 A1 | 11/2011 | Koo et al. |
| 2012/0051005 A1* | 3/2012 | Vanfleteren ........... H01L 21/565 361/749 |
| 2012/0052268 A1 | 3/2012 | Axisa et al. |
| 2012/0314382 A1* | 12/2012 | Wesselmann ........ H05K 1/0283 361/749 |
| 2013/0176689 A1 | 7/2013 | Nishimura et al. |
| 2013/0312256 A1* | 11/2013 | Wesselmann ........ H05K 1/0283 29/830 |
| 2014/0104793 A1* | 4/2014 | Park .................... H05K 1/0283 361/749 |

FOREIGN PATENT DOCUMENTS

| | | |
|---|---|---|
| JP | 2006324406 A | 11/2006 |
| JP | 2013187308 A | 9/2013 |
| JP | 2013187380 A | 9/2013 |
| WO | 2010086034 A1 | 8/2010 |
| WO | 2012049895 A1 | 4/2012 |

OTHER PUBLICATIONS

Notification of Reasons for Refusal for Corresponding JP Application No. 2014-164114; dated Jun. 12, 2018.

\* cited by examiner

US 10,136,514 B2

EXTENSIBLE FLEXIBLE PRINTED CIRCUIT BOARD AND METHOD FOR MANUFACTURING EXTENSIBLE FLEXIBLE PRINTED CIRCUIT BOARD

This is the U.S. national stage of application No. PCT/JP2015/060780, filed on Apr. 6, 2015. Priority under 35 U.S.C. § 119(a) and 35 U.S.C. § 365(b) is claimed from Japanese Application No. 2014-164114, filed Aug. 12, 2014, the disclosure of which is also incorporated herein by reference.

TECHNICAL FIELD

The present invention relates to an extensible flexible printed circuit board and a method for manufacturing the extensible flexible printed circuit board.

BACKGROUND ART

In recent years, a demand for an extensible flexible printed circuit board in which a flexible printed circuit board has extensibility increases. Some extensible flexible printed circuit boards are used as a component of, for example, so-called a wearable electronic device attached to a human body or clothing in addition to a robot performing a variety of motions.

In the wearable electronic device, there is a case when it is attached to a bending portion of a human body such as, for example, a joint or the like, and it is necessary to consider capability of bending and twisting of the wearable electronic device to enable the attachment to the bending portion as stated above. Besides, it is necessary to consider a waterproof property when attaching to the human body.

There are technical contents disclosed in, for example, Patent Literatures 1 to 4 to correspond to requirements as stated above. In Patent Literatures 1 to 4, there is disclosed a configuration in which a land pattern and a wiring layer (an extensible pattern) are provided at an extensible insulating base material, and the wiring layer is covered by an extensible insulating layer.

CITATION LIST

Patent Literature

{PTL 1} JP 2013-187308 A
{PTL 2} JP 2013-187380 A
{PTL 3} US 2009/0317639A1
{PTL 4} WO 2010/086034A1

SUMMARY OF INVENTION

Technical Problem

Incidentally, in the above-stated wearable electronic devices, there is a requirement for multilayering in addition to the extensibility. However, according to each of the configurations disclosed in Patent Literatures 1 to 4, a configuration in which a single-layered wiring layer is directly stacked on an insulating base material such as an elastomer is employed. It is therefore difficult to enable the multilayering based on the configurations disclosed in Patent Literatures 1 to 4.

Note that according to the configurations disclosed in Patent Literatures 1 to 3, an extensible wiring layer is formed separately from flexible printed circuit board, and there is a problem that a lot of man-hours are required. Besides, according to the configuration disclosed in Patent Literature 4, a supporting member is necessary until midway of a manufacturing process, and therefore, it is difficult to mount electronic components on a mounting board part by soldering or the like.

The present invention is made based on the above-described circumstances, and an object thereof is to provide an extensible flexible printed circuit board in which multilayering is possible and mounting of components can be easily performed, and a method for manufacturing the extensible flexible printed circuit board.

Solution to Problem

In order to solve the above-described problems, according to a first aspect of the present invention, there is provided an extensible flexible printed circuit board being an extensible flexible printed circuit board having extensibility, including: a component mounting part which has a base circuit board set to be one or a plurality of flexible printed circuit boards having a plurality of conductive layers and an insulating layer, and the component mounting part being provided at least at parts of the base circuit board, and capable of mounting electronic components; an extensible conductive part provided at least at a part of the base circuit board, the extensible conductive part having a plurality of joint parts each intersecting a center line when an extension/contraction direction is set to the center line and a plurality of curved parts each continuing from an end part of the joint part, and proceeding from the joint part to return to the center line side, and exhibiting extensibility by the curved parts bending to open or close; and a covering member whose material is a flexibly deformable elastomer, and which covers the component mounting parts and the extensible conductive part.

Further, in another aspect of the present invention, it is preferable that in the above-stated invention, the base circuit board has the plurality of flexible printed circuit boards, and, at the extensible conductive part, the flexible printed circuit boards are disposed to face each other under a state where an adhesive layer does not intervene between the plurality of flexible printed circuit boards.

Further, in another aspect of the present invention, it is preferable that in the above-stated invention, an arc angle of the curved part is provided to be 180 degrees or less under a state where an external force is not applied, and the curved part is provided in a bellows state by alternately switching a direction of the curve.

Further, in another aspect of the present invention, it is preferable that in the above-stated invention, a plurality of extensible pattern parts are formed at the extensible conductive part by laser machining.

Further, in another aspect of the present invention, it is preferable that in the above-stated invention, at least one of thicknesses of a front surface side and a rear surface side of the covering member is provided such that a portion covering the component mounting part is thicker than a portion covering the extensible conductive part.

Further, in another aspect of the present invention, it is preferable that in the above-described invention, the covering member is formed by injection molding of a liquid elastomer raw material.

Further, according to a second aspect of the present invention, there is provided a manufacturing method of an extensible flexible printed circuit board with extensibility, setting flexible printed circuit boards each having a plurality of conductive layers and an insulating layer as a base circuit board; including component mounting parts capable of mounting electronic components and an extensible conductive part including a plurality of joint parts each intersecting a center line when an extension/contraction direction is set to the center line and a plurality of curved parts each continuing from an end part of each joint part, proceed from the joint part and curve to return to the center line side, and exhibiting extensibility by the curved parts bending to open or close, the component mounting parts and the extensible conductive part being provided at least at parts of the base circuit board; and further including a covering member whose material is a flexibly deformable elastomer, and which covers the component mounting parts and the extensible conductive part, the manufacturing method of the extensible flexible printed circuit board including: a laser machining step forming the extensible conductive part by performing laser machining for at least a part of the base circuit board; and an injection molding step forming the covering member which covers the component mounting parts and the extensible conductive part by injection molding.

Advantageous Effects of Invention

According to an extensible flexible printed circuit board and a manufacturing method of the extensible flexible printed circuit board of the present invention, multilayering is possible and mounting of components is able to be easily performed.

DESCRIPTION OF EMBODIMENTS

Hereinafter, an extensible flexible printed circuit board 10 according to one embodiment of the present invention will be described. The following explanation is sometimes made by using an XYZ orthogonal coordinate system. In the above, an X direction is set to a longitudinal direction of the extensible flexible printed circuit board 10, in which an X1 side is set to a right side in FIG. 1, and an X2 side is set to a left side. Besides, a Y direction is set to a width direction of the extensible flexible printed circuit board 10, in which a Y1 side is set to a near side of a paper surface in FIG. 1 and a Y2 side is set to a distant side of the paper surface. Further, a Z direction is set to a thickness direction of the extensible flexible printed circuit board 10, in which Z1 is set to a distant side of a paper surface in FIG. 3 and Z2 is set to a near side of the paper surface.

<Regarding Configuration of Extensible Flexible Printed Circuit Board 10>

Figure 1:
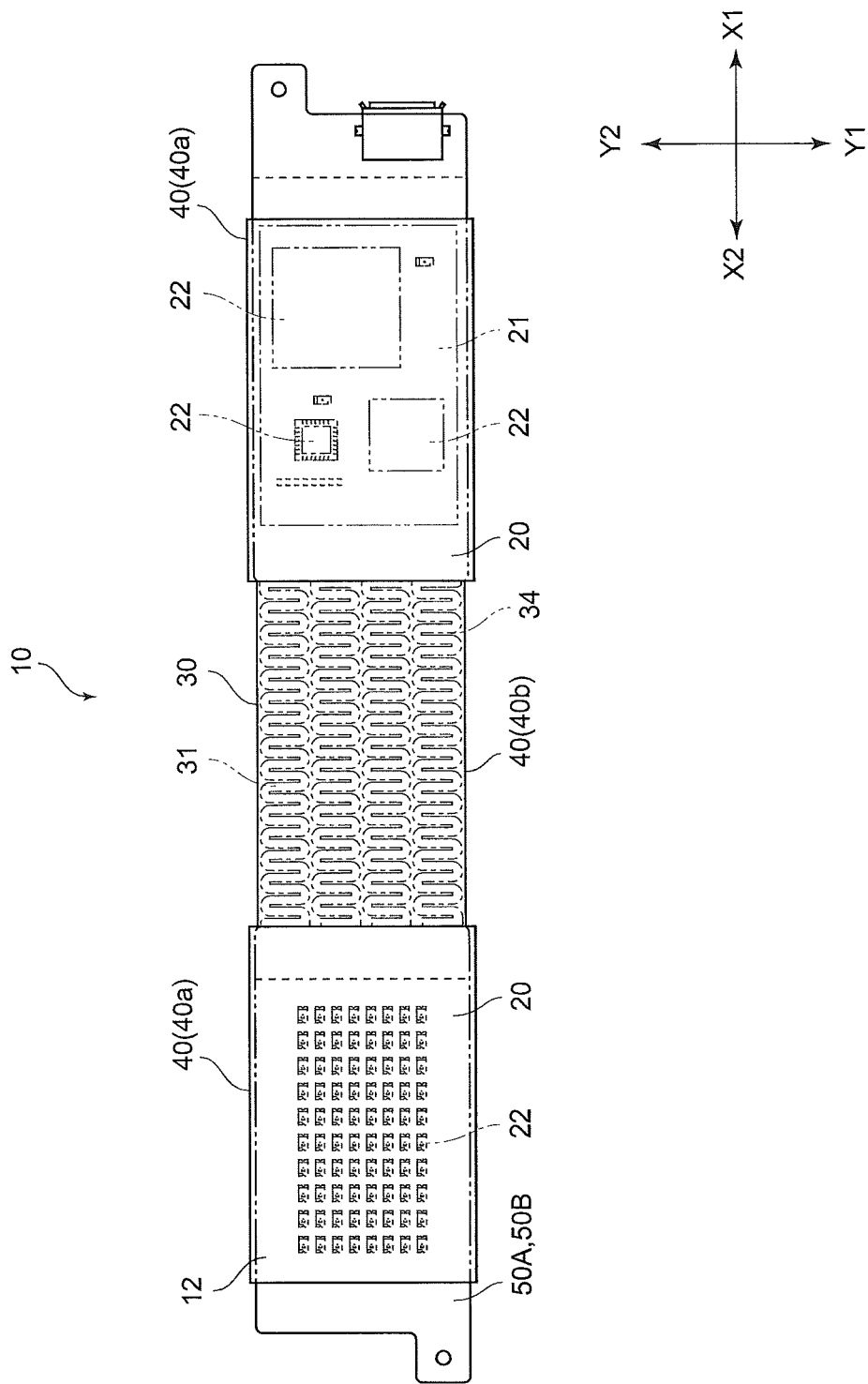
FIG. 1 is a plan view according to one embodiment of the present invention, and illustrating a configuration of an extensible flexible printed circuit board.
Figure 2:
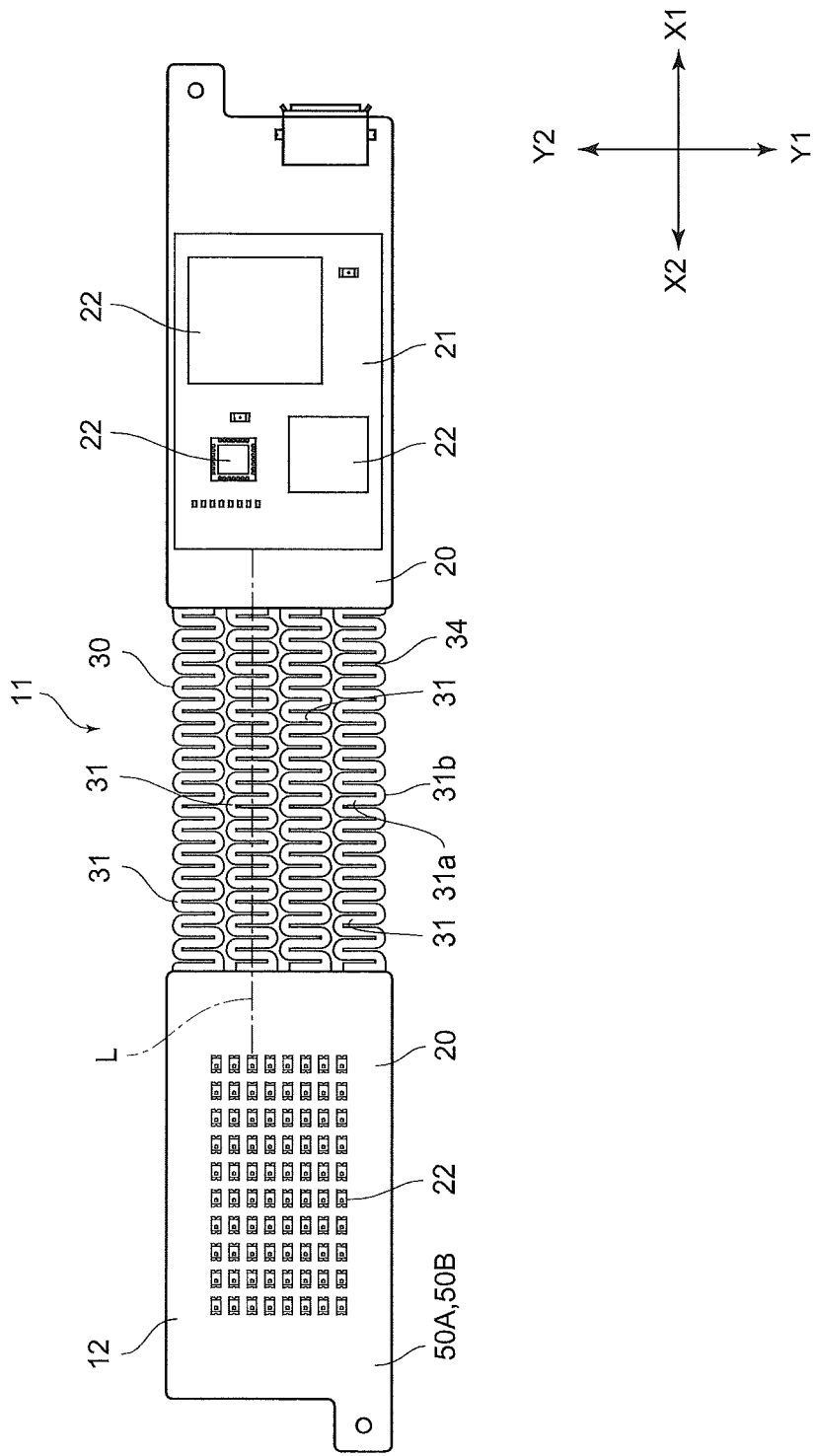
FIG. 2 is a plan view illustrating a configuration of the extensible flexible printed circuit board before it is covered by a covering member.

FIG. 1 is a plan view illustrating a configuration of the extensible flexible printed circuit board 10. FIG. 2 is a plan view illustrating a configuration of the extensible flexible printed circuit board 11 before it is covered by a covering member 40. Besides, FIG. 3 is a sectional side view illustrating the configuration of the extensible flexible printed circuit board 10.

Figure 3:
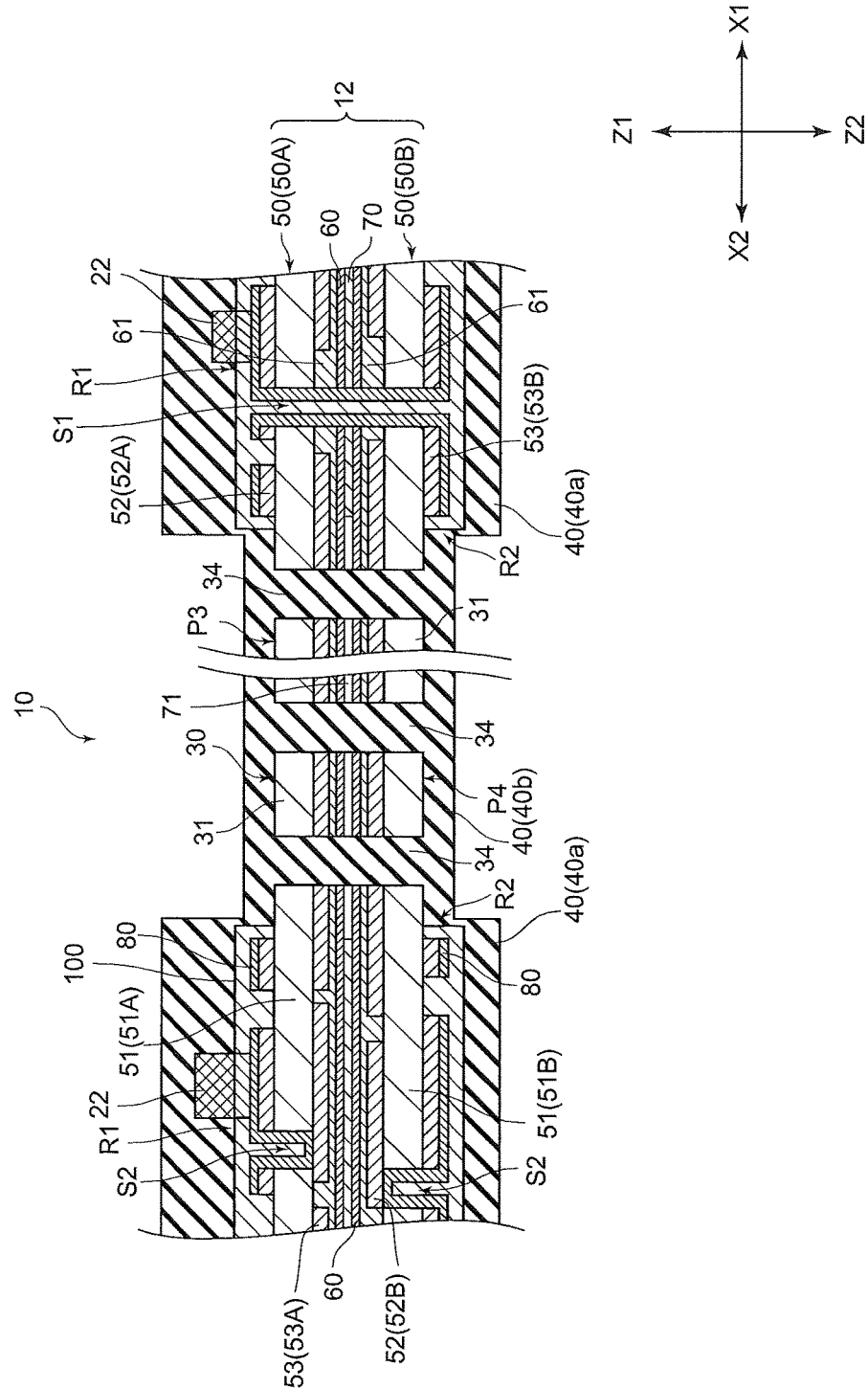
FIG. 3 is a sectional side view illustrating a configuration of the extensible flexible printed circuit board.

The extensible flexible printed circuit board 10 illustrated in FIG. 1 to FIG. 3 is formed by setting flexible printed circuit boards (FPC base materials 50A, 50B) as a base circuit board 12, and covering the base circuit board 12 with the covering member 40 with extensibility such as an elastomer. Note that an example in which the base circuit board 12 is made up of two FPC base materials 50A, 50B is illustrated in FIG. 3. However, the base circuit board 12 may be made up of three or more FPC base materials 50, or may be made up of one FPC base material 50.

As illustrated in FIG. 1 to FIG. 3, the extensible flexible printed circuit board 10 includes component mounting parts 20 and an extensible conductive part 30. The component mounting part 20 includes a mounting board part 21 capable of mounting various electronic components 22.

Besides, as illustrated in FIG. 1 and FIG. 2, the extensible conductive part 30 includes extensible pattern parts 31 which are narrow in width and folded in a zigzag state (bellows state), and is formed by covering the extensible pattern parts 31 with the covering member 40. When the extensible pattern parts 31 are formed, punched parts 34 are provided by irradiating laser beam or the like to the extensible conductive part 30. The extensible pattern parts 31 in the zigzag state (bellows state) are thereby formed, and the adjacent extensible pattern parts 31 are in independent states from one another.

The extensible conductive part 30 enables various deformations such as extension/contraction, bending, and twisting. Specifically, a plurality of extensible pattern parts 31 are provided at the extensible conductive part 30. Each of the extensible pattern parts 31 has a joint part 31a and a curved part 31b. The joint part 31a is a part which intersects a center line when an extension/contraction direction of the extensible conductive part 30 is set to the center line (only one center line L is illustrated in FIG. 2, but the similar center line L exists at each extensible pattern part 31). In FIG. 2, the joint part 31a is provided to be orthogonal to the center line L. However, the joint part 31a may be disposed not to be orthogonal to the center line L.

Besides, the curved part 31b is coupled to an end part of the joint part 31a. When it starts from the joint part 31a to the curved part 31b, it returns to the center line L again due to curvature of the curved part 31b. At this time, the other end part of the curved part 31b is coupled to another joint part 31a different from the joint part 31a where one end part of the curved part 31b is coupled. The curved part 31b is bent to open or to close, and thereby, the extensible conductive part 30 is able to exhibit extensibility.

Note that in the present embodiment, an arc angle of the curved part 31b is provided to be 180 degrees or less than 180 degrees under a state where external force is not applied to the extensible conductive part 30. If the arc angle of the curved part 31b exceeds 180 degrees and the curbed part 31b is a horseshoe shape, parts whose intervals are narrow are formed between the adjacent joint parts 31a and curved parts 31b at a covering member 40b covering the extensible pattern parts 31. Accordingly, a width of the covering member 40b which enters into each of the punched parts 34 is also narrow, and therefore, it is difficult to deform even when the adjacent joint part 31a and curved part 31b are forced to be deformed to open (to extend). However, in the present embodiment, the arc angle of the curved part 31b is provided to be 180 degrees or less than 180 degrees or less under the state where the external force is not applied to the extensible conductive part 30. Therefore, the difficulty in deformation as stated above is prevented.

Besides, at least a part (particularly, a part where the electronic components 22 are mounted) of the component mounting part 20 and the extensible conductive part 30 are covered with the covering member 40. The covering member 40 is made of material excellent in extensibility such as the elastomer. Therefore, even when the extensible conductive part 30 performs various deformations such as extension/contraction and twisting, the covering member 40 is able to follow the deformation. Note that the component mounting part 20 is not a part which undergoes the deformation such as the extension/contraction and the twisting. However, a waterproof property and a dustproof property can be exhibited by covering the electronic components 22 or the like mounted on the component mounting part 20 with the covering member 40. Besides, it is possible to protect the electronic components 22 from impact or the like.

In the following description, a part of the covering member 40 located at the component mounting part 20 side is called as a covering member 40a, and a part of the covering member 40 located at the extensible conductive part 30 side is called as the covering member 40b according to need. However, both are generically called as the covering member 40 when it is not necessary to distinguish between the covering member 40a and the covering member 40b.

Besides, the covering member 40a may be set to a constituent of the component mounting part 20, or a constituent different from the component mounting part 20. Besides, the covering member 40b may be set to a constituent of the extensible conductive part 30, or a constituent different from the extensible conductive part 30.

Here, a thickness from a front surface (a surface at the Z1 side) of the covering member 40b to a front surface (a surface at the Z1 side) of the extensible pattern part 31 is provided to be equivalent to or thicker than a thickness from a front surface (a surface at the Z1 side) of the electronic component 22 which is the thickest in the covering member 40a to a front surface (a surface at the Z1 side) of the mounting board part 21. For example, when the covering member 40 is made up of a silicone elastomer, there is one in which the thickness from the front surface of the covering member 40b to the front surface of the extensible pattern part 31 is set to 0.2 mm, and the thickness from the front surface of the electronic component 22 to the front surface of the mounting board part 21 is set to 0.2 mm or more (for example, 0.3 mm or more).

Similarly, a thickness from a rear surface (a surface at the Z2 side) of the covering member 40b to a rear surface (a surface at the Z2 side) of the extensible pattern part 31 is provided to be equivalent to or thicker than a thickness from a rear surface (a surface at the Z2 side) of the electronic component 22 which is the thickest in the covering member 40a to a rear surface (a surface at the Z2 side) of the mounting board part 21. It is thereby possible to make extensibility at the extensible conductive part 30 good. However, the thicknesses of the covering members 40a, 40b are not limited thereto, and are able to be set to appropriate sizes.

Note that the extensible pattern part 31 includes multi-layered conductive layers 52, 53. Namely, the extensible conductive part 30 in the present embodiment has a multi-layer structure, in addition, bending operations such as extension/contraction and twisting are possible. However, the extensible pattern part 31 may have a configuration including a single conductive layer.

Further, the extensible conductive part 30 has a configuration where an adhesive layer does not exist, different from the component mounting part 20 as illustrated in FIG. 3. In general, the adhesive layer is a hardest part in the flexible printed circuit board. Therefore, flexibility of the extensible conductive part 30 is prevented if the adhesive layer exists. However, a configuration where the adhesive layer is not provided is employed to the extensible conductive part 30, and thereby, the extensible conductive part 30 has a configuration further excellent in various bending operations such as extension/contraction and twisting.

<Regarding Manufacturing Method of Extensible Flexible Printed Circuit Board 10>

Hereinafter, details of a configuration of the extensible flexible printed circuit board 10 are described while describing a manufacturing method of the extensible flexible printed circuit board 10.

(1) First Step: Preparation of FPC Base Material 50

Figure 4:
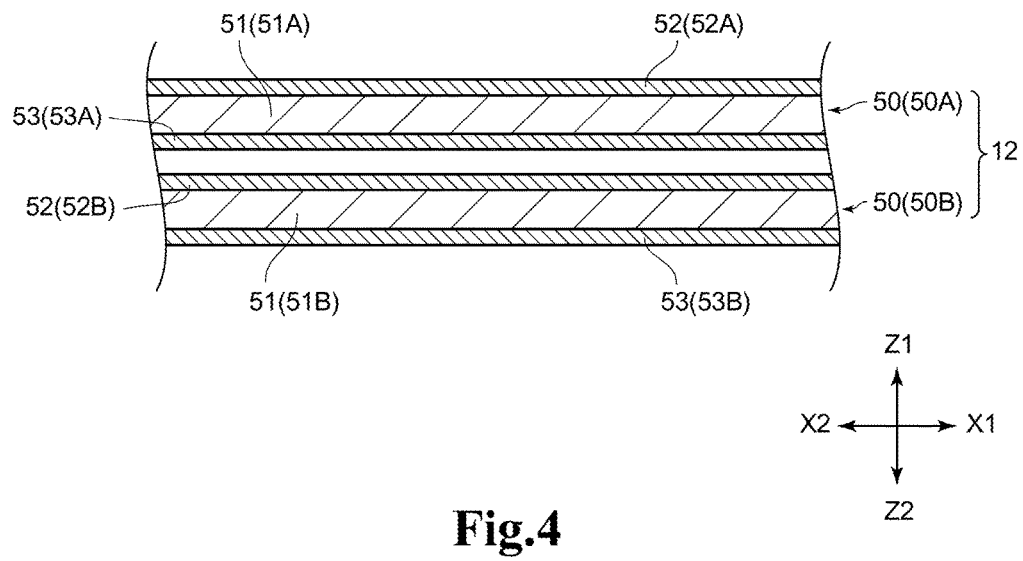
FIG. 4 is a sectional side view according to a first step, and illustrating two FPC base materials.

FIG. 4 is a sectional side view illustrating two FPC base materials 50. The FPC base materials 50 illustrated in FIG. 4 each include the conductive layers 52, 53 at both surfaces of a base material 51 (corresponding to an insulating layer) having flexibility and an electrical insulating property. The base material 51 is formed by a film material such as, for example, a polyimide film whose extensibility is largely inferior to the elastomer. However, the material of the base material 51 is not limited to the polyimide film, but may be other ones as long as the flexibility and the insulating property are included. The conductive layers 52, 53 each are a metal foil such as, for example, a copper foil, but the material may be other ones as long as having conductivity.

Besides, in a configuration illustrated in FIG. 4, a double-sided laminated board where the conductive layers 52, 53 are provided at the both surfaces of the base material 51 such as, for example, a double-sided copper-clad laminated board is illustrated as the FPC base material 50. However, the FPC base material 50 may be a single-sided laminate (for example, a single-sided copper-clad laminate) where the conductive layer 52 (or the conductive layer 53) is provided at one surface of the base material 51. Besides, a case when two FPC base materials 50 are used is illustrated in FIG. 4. However, the configuration may be one where three or more sheets of the FPC base materials 50 may be used, or one FPC base material 50 is used (namely, two layers of the conductive layers 52 exist).

In the following description, the FPC base material 50 at an upper side (Z1 side) in FIG. 4 is called as an FPC base material 50A, and the FPC base material 50 at a lower side (Z2 side) is called as an FPC base material 50B according to need to distinguish between the two FPC base materials 50. Similarly, the base material 51 and the conductive layers 52, 53 of the FPC base material 50A are respectively called as a base material 51A, and conductive layers 52A, 53A, and the base material 51 and the conductive layers 52 of the FPC base material 50B are respectively called as a base material 51B, and conductive layers 52B, 53B.

However, when it is not necessary to distinguish between the FPC base material 50A and the FPC base material 50B, both are generically called just as the FPC base materials 50. Similarly, when it is not necessary to distinguish between the base material 51A and the base material 51B, both are generically called just as the base materials 51, and when it is not necessary to distinguish between the conductive layers 52A, 53A and the conductive layers 52B, 53B, both are generically called just as the conductive layers 52, 53.

(2) Second Step: Patterning of Inner Layer

Figure 5:
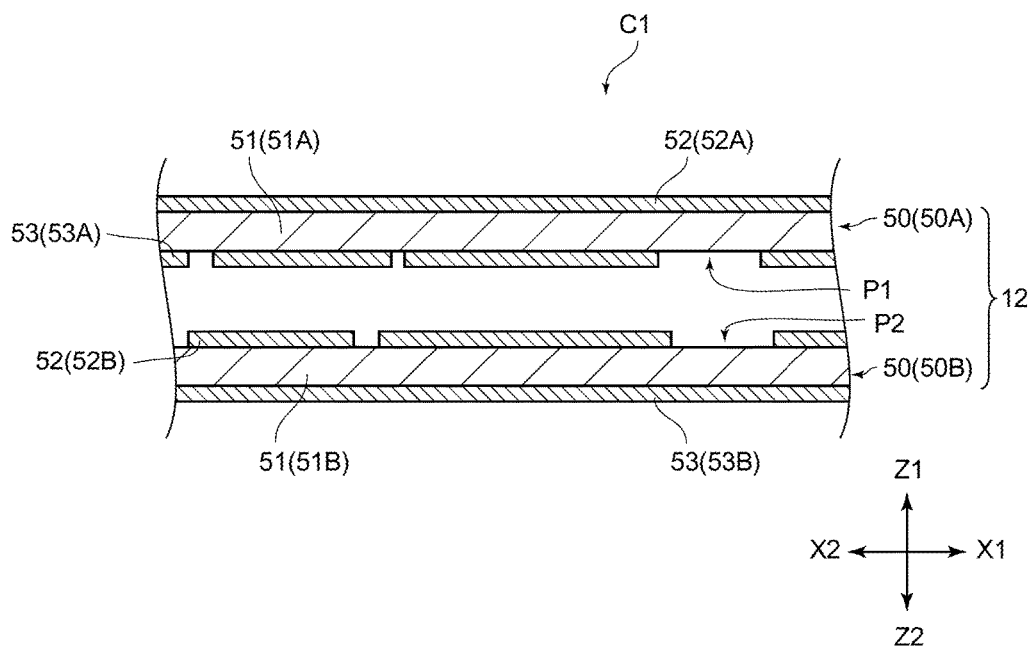
FIG. 5 is a sectional side view according to a second step, and illustrating a state where circuit patterns are formed by patterning each of facing conductive layers on the two FPC base materials.

FIG. 5 is a sectional side view illustrating a state where circuit patterns P1, P2 are formed by patterning each of the facing conductive layers 53A, 52B in the two FPC base materials 50A, 50B. When the patterning as illustrated in FIG. 5 is performed, a pretreatment to enhance adhesiveness before a dry film (a photoresist layer) is laminated (dry film continuous pretreatment) is performed for the conductive layer 53A and the conductive layer 52B. Next, the dry film is laminated for the conductive layer 53A and the conductive layer 52B.

Next, exposure is performed for the dry film (dry film continuous exposure) by ultraviolet irradiation or the like using a mask, then development to remove uncured dry films is performed after the exposure, and further, etching is performed for the conductive layer 53A and the conductive layer 52B. Peeling off of the dry film is further performed. A product where the circuit patterns P1, P2 are formed as illustrated in FIG. 5 is thereby obtained. Note that the product obtained by the patterning is set to an intermediate product C1.

(3) Third Step: Lamination of Patterned Part

Figure 6:
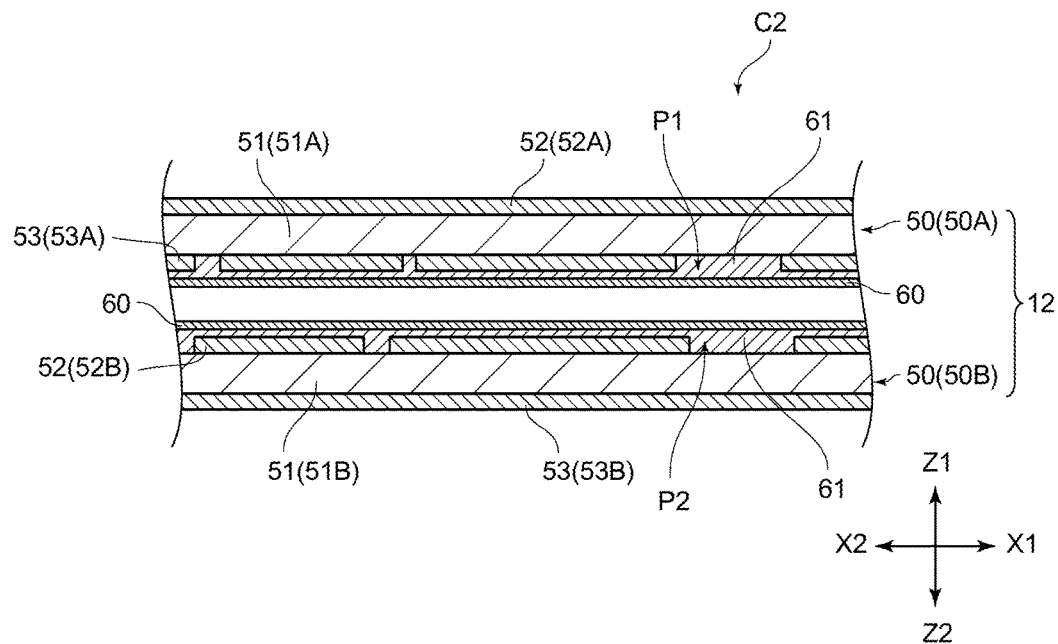
FIG. 6 is a sectional side view according to a third step, and illustrating a state where laminating is applied to each of the patterned two conductive layers.

FIG. 6 is a sectional side view illustrating a state where lamination is performed for the patterned two conductive layers 53A, 52B. Temporary adhesion of a cover film 60 is performed for the intermediate product C1 where the patterning as illustrated in FIG. 5 is performed while adjusting a position. An adhesive 61 with a thermosetting property or the like is coated in advance on the cover film 60. After the temporary adhesion, it is pressurized by using a member such as a steel sheet, and is further heated. A part corresponding to the insulting layer is thereby formed. Note that a product for which the cover film 60 is laminated is set to an intermediate product C2.

(4) Fourth Step: Lamination of Patterned Part

Figure 7:
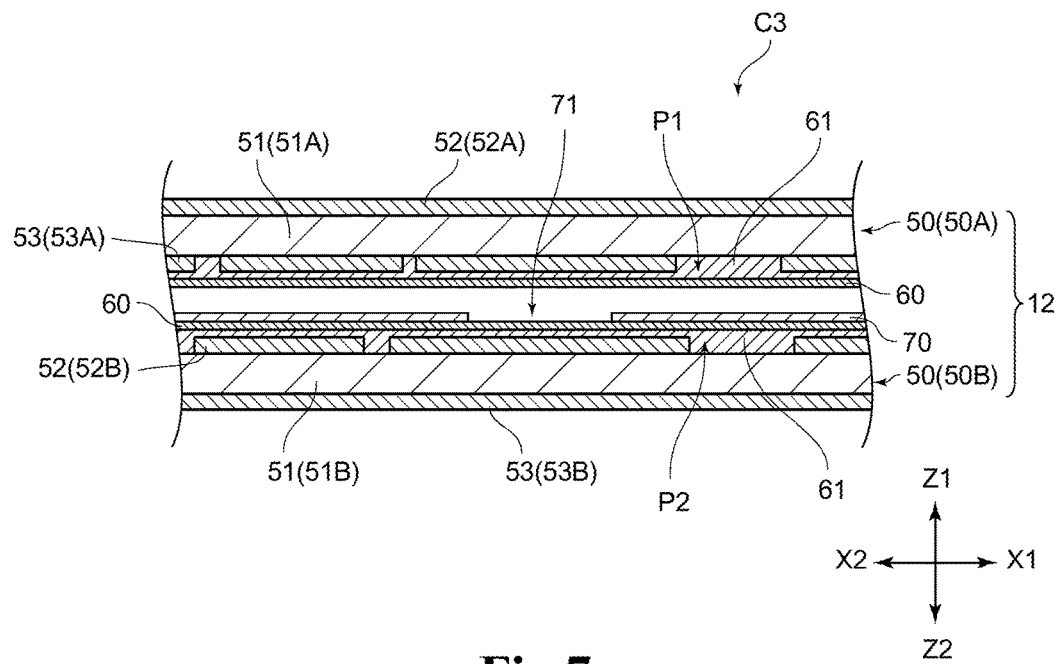
FIG. 7 is a sectional side view according to a fourth step, and illustrating a state where a stacking adhesive is laminated for the conductive layer.

FIG. 7 is a sectional side view illustrating a state where a stacking adhesive 70 is laminated for the conductive layer 52B. As illustrated in FIG. 7, lamination of, for example, the sheet-state stacking adhesive 70 is performed for the conductive layer 52B. In this case, a punched part 71 is formed by a press or the like for the sheet-state adhesive (the adhesive sheet) such as, for example, a prepreg and a bond ply. After that, the temporary adhesion is performed while adjusting the position of the punched part 71 or the like, and thereafter, soft lamination of the stacking adhesive 70 is performed. The lamination of the stacking adhesive 70 may be performed not for the conductive layer 52B but for the conductive layer 53A. Note that a product under a state in which the stacking adhesive 70 is laminated is set to an intermediate product C3. Besides, the stacking adhesive 70 may be one which corresponds to the insulating layer.

(5) Fifth Step: Stacking of FPC Base Material 50A and FPC Base Material 50B

Figure 8:
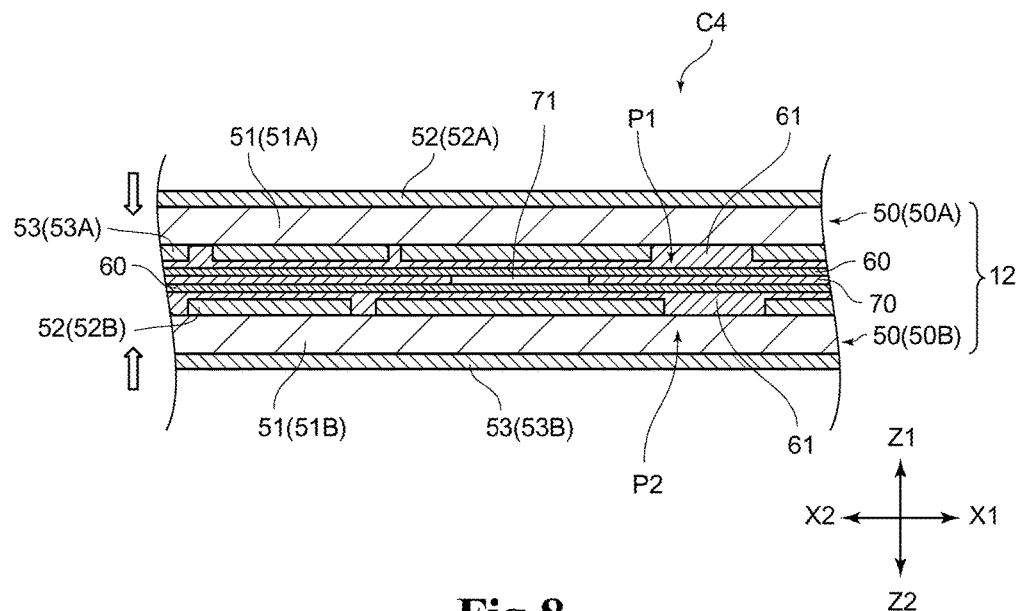
FIG. 8 is a sectional side view according to a fifth step, and illustrating a state where the two FPC base materials are stacked.

FIG. 8 is a sectional side view illustrating a state where the two FPC base materials 50A, 50B are stacked. When the stacking as illustrated in FIG. 8 is performed, a temporary adhesion (stacking temporary adhesion) where the FPC base material 50A and the FPC base material 50B are brought into contact while adjusting positions is performed. After that, they are pressurized by using a member such as a steel plate, then further heated to enable thermal-curing of the stacking adhesive 70. The FPC base material 50A and the FPC base material 50B are thereby not adhered at a portion where the punched part 71 exists, but they become a state where the FPC base material 50A and the FPC base material 50B are adhered at the other parts. Note that a product after the stacking adhesion is performed is set to an intermediate product C4.

(6) Sixth Step: Formation of Through Hole S1

Figure 9:
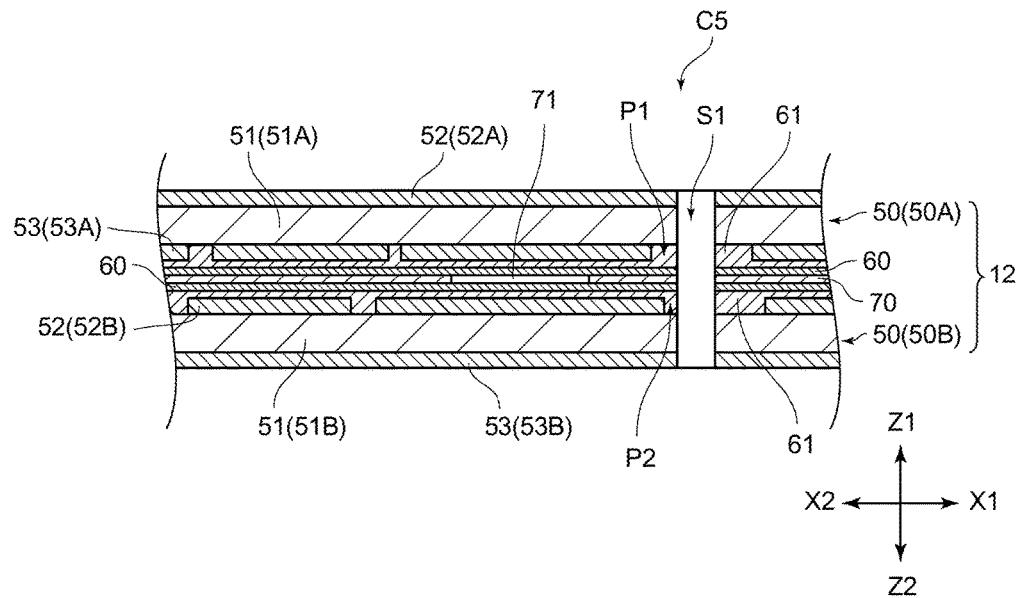
FIG. 9 is a sectional side view according to a sixth step, and illustrating an intermediate product under a state where a through hole is formed.

FIG. 9 is a sectional side view illustrating an intermediate product C5 under a state where a through hole S1 is formed. As illustrated in FIG. 9, the through hole S1 is formed for the intermediate product C4 after the stacking. At this time, for example, an NC machining using a drill is performed, and thereby, the through hole S1 penetrating the intermediate product C5 under the state as illustrated in FIG. 9 is formed.

(7) Seventh Step: Via Process

Figure 10:
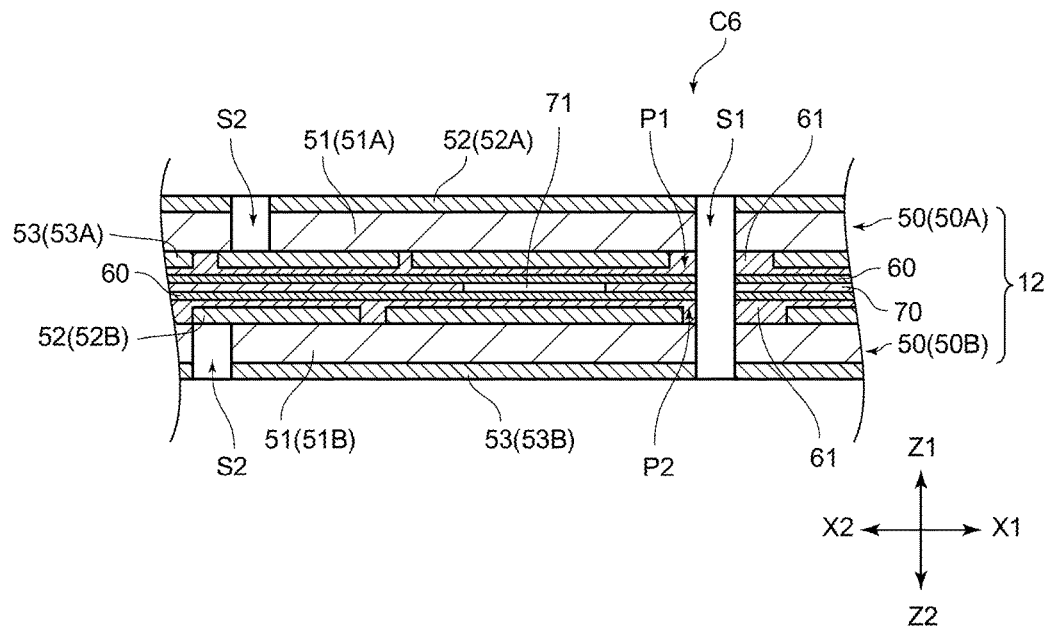
FIG. 10 is a sectional side view according to a seventh step, and illustrating the intermediate product under a state where vias are formed.

FIG. 10 is a sectional side view illustrating an intermediate product C6 under a state where vias S2 are formed. As illustrated in FIG. 10, the vias S2 are formed for the intermediate product C5 by using, for example, laser. The via S2 formed at the FPC base material 50A is formed up to a position reaching the conductive layer 52B by penetrating through the conductive layer 52A and the base material 51. Similarly, the via S2 formed at the FPC base material 50B is formed up to a position reaching the conductive layer 52B by penetrating through the conductive layer 53B and the base material 51.

(8) Eighth Step: Conduction Treatment

Figure 11:
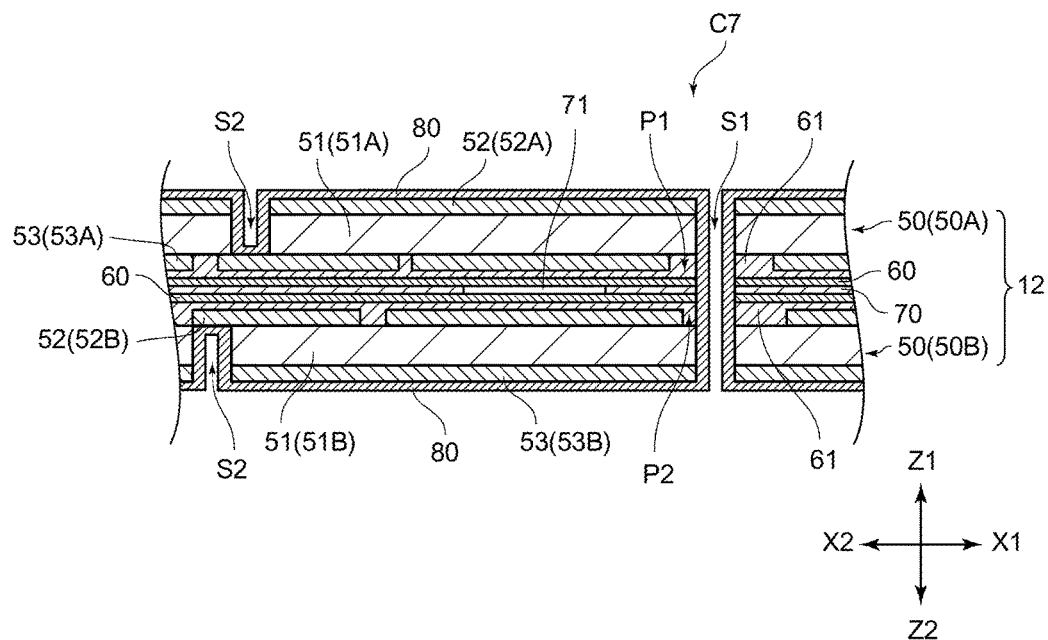
FIG. 11 is a sectional side view according to an eighth step, and illustrating a state where a conduction treatment is performed for the intermediate product illustrated in FIG. 10.

FIG. 11 is a sectional side view illustrating a state where a conduction treatment is performed for the intermediate product C6 illustrated in FIG. 10. As illustrated in FIG. 11, the conduction treatment is performed for the intermediate product C6 where the through hole S1 and the vias S2 are formed, to form a plating coating film (a conductive coating film 80). In this case, at first, a desmear process is performed to remove excessive smear. Next, the conduction treatment is performed so that plating easily adheres thereto, and thereafter, the plating coating film (the conductive coating film 80) is formed by a plating process. Note that a product after the conductive coating film 80 is formed is set to an intermediate product C7.

(9) Ninth Step: Patterning of Outer Layer

Figure 12:
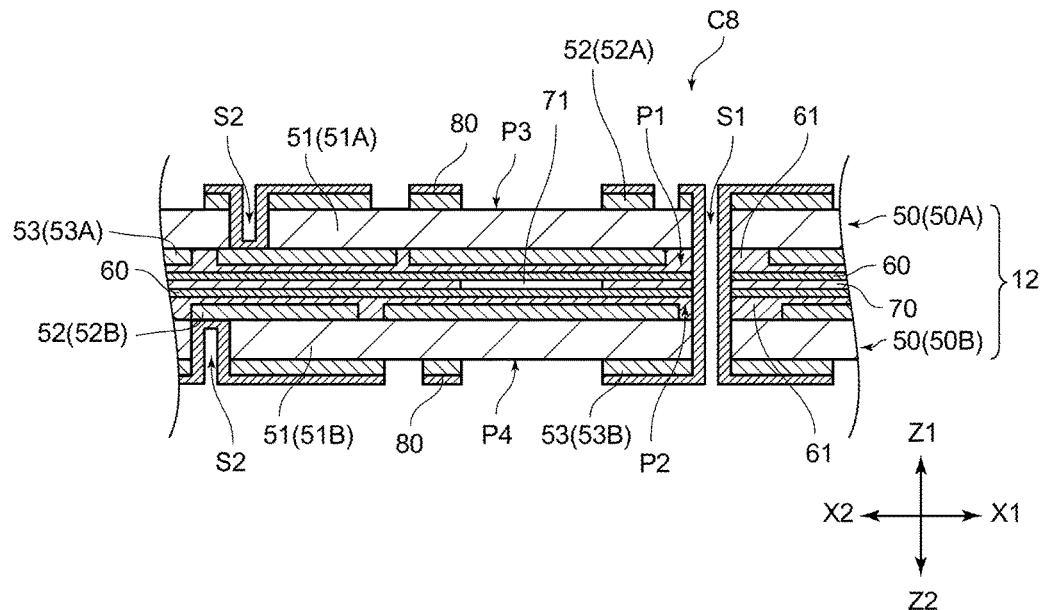
FIG. 12 is a sectional side view according to a ninth step, and illustrating a state where circuit patterns are formed by patterning each of not facing conductive layers in the two FPC base materials for the intermediate product illustrated in FIG. 11.

FIG. 12 is a sectional side view illustrating a state where circuit patterns P3, P4 are formed by respectively patterning the conductive layers 52A, 53B at not facing sides of the two FPC base materials 50A, 50B for the intermediate product C7 illustrated in FIG. 11. A photofabrication method as same as the method in the above-stated second step is used also as the method when the circuit patterns P3, P4 are formed, and etching is performed for the conductive layer 52A and the conductive layer 53B. The circuit patterns P3, P4 are thereby formed. Note that a product after the circuit patterns P3, P4 are formed is set to an intermediate product C8.

(10) Tenth Step: Photo-Solder Resist Process

Figure 13:
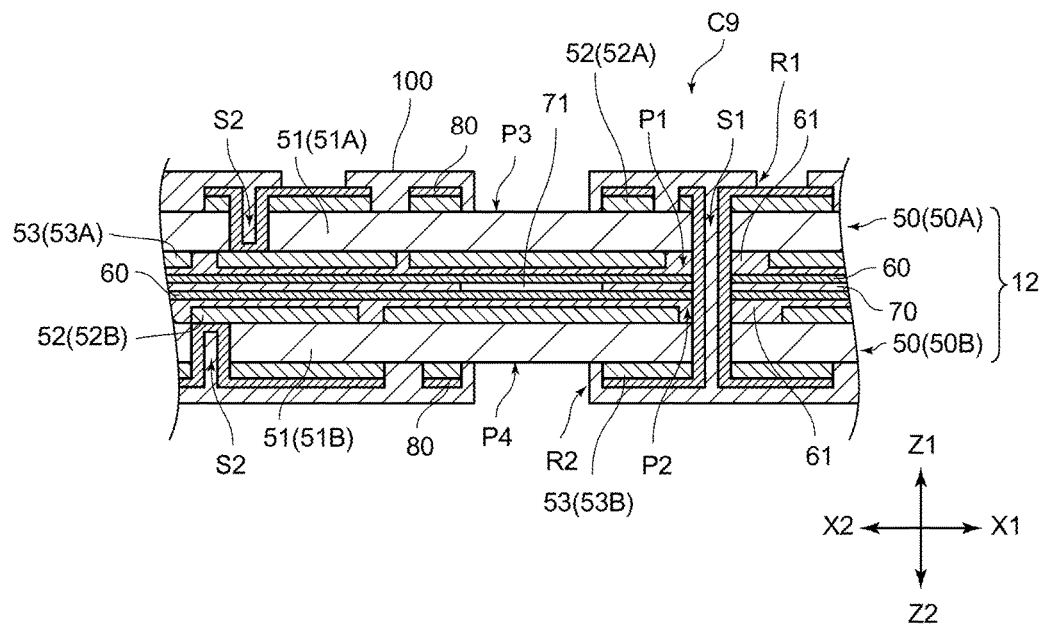
FIG. 13 is a sectional side view according to a tenth step, and illustrating a state where solder-resist patterns are formed for the intermediate product illustrated in FIG. 12.

FIG. 13 is a sectional side view illustrating a state where solder-resist patterns R1, R2 are formed for the intermediate product C8 illustrated in FIG. 12. When the solder-resist patterns R1, R2 are formed, it is possible to use, for example, a photo-solder resist. In this case, solder-resist layers 100 are formed at the conductive layer 52A side and the conductive layer 53B side by, for example, printing. After that, the printed solder-resist layers 100 are dried. Subsequently, exposure is performed for the solder-resist layers 100 by ultraviolet irradiation or the like using a mask (photo-solder exposure), after the exposure, uncured parts are removed by using a solution such as, for example, a sodium carbonate aqueous solution (photo-solder development). A heat hardening is performed for the solder-resist layers 100 after the development. Note that a product after the solder-resist patterns R1, R2 are formed is set to an intermediate product C9.

Note that a rust-proof treatment or the like may be performed after the solder-resist patterns R1, R2 are formed.

(11) Eleventh Step: Formation of Extensible Conductive Part 30 and Mounting

Figure 14:
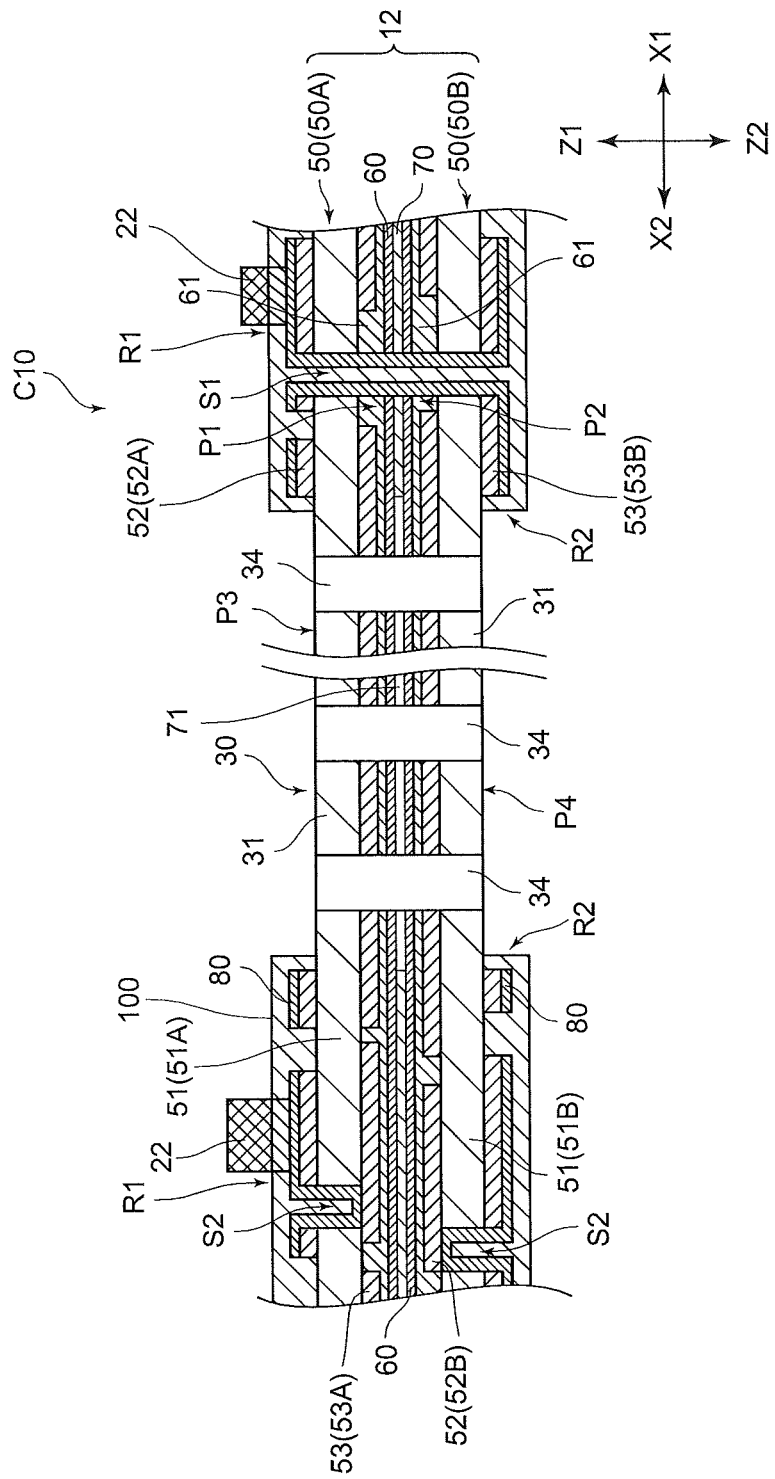
FIG. 14 is a sectional side view according to an eleventh step, and illustrating a state where electronic components are mounted and the extensible conductive part is formed on the intermediate product illustrated in FIG. 13.

FIG. 14 is a sectional side view illustrating a state where the electronic components 22 are mounted and the extensible conductive part 30 is formed at the intermediate product C9 illustrated in FIG. 13. As illustrated in FIG. 14, machining using laser beam is performed for the intermediate product C9 to form the extensible pattern parts 31 as illustrated in FIG. 1 and FIG. 2. In the machining using the laser beam, the laser beam is irradiated so that the intermediate product C9 is penetrated to form the punched parts 34, and the laser beam is scanned at a predetermined speed so as to form the bellows state extensible pattern parts 31 in FIG. 1 and FIG. 2. The punched parts 34 as illustrated in FIG. 14 and FIG. 2 are thereby formed (corresponding to the laser machining step). However, when a width of the punched part 34 is allowed to be wide, the extensible conductive part 30 including the extensible pattern parts 31 may be formed by using methods other than the laser beam (for example, press working).

When the laser beam is used, it is possible to make a spot diameter small by adjustment or the like of optical elements. On the other hand, according to a method in which cutting is performed by using a blade such as, for example, the press working, there is a limit in a blade thickness in terms of strength of the blade. For example, it is currently difficult or it costs very high even if possible to form the blade with a blade thickness of 0.75 mm or less. However, according to the laser beam, it is easy to enable the spot diameter of, for example, 0.2 mm or less. Accordingly, when the punched parts 34 are formed by the laser machining, it becomes possible to make the width narrower compared to the case when the punched parts 34 are formed by the press working or the like. Namely, high-precision machining of the extensible pattern parts 31 becomes possible.

Besides, the electronic components 22 are mounted on the component mounting parts 20 of the intermediate product C9. When the electronic components 22 are mounted, a solder such as a cream solder for mounting is printed, and the electronic components 22 are mounted after the printing. After that, the solder is melted in a reflow furnace or the like, and the electronic components 22 are electrically connected to the component mounting parts 20 by cooling and solidification of the solder.

Note that before and after the mounting of the electronic components 22, the extensible flexible printed circuit board 10 is cut out from the sheet-state flexible printed circuit board so as to have an outer shape of the extensible flexible printed circuit board 10. Note that a product where the extensible conductive part 30 is formed and the electronic components 22 are mounted as illustrated in FIG. 14 is set to an intermediate product C10.

(12) Twelfth Step: Formation of Covering Member 40

As it is already described based on FIG. 3, the covering member 40 is able to be formed by, for example, a LIM (liquid injection molding) molding. In the LIM molding, the intermediate product C10 is placed in a metal die. After that, a liquid-state elastomer raw material is poured thereinto at a predetermined pressure (corresponding to an injection molding step). Note that, in general, it is possible to use a two-liquid mixed type thermosetting liquid silicone elastomer as the elastomer raw material. However, a one-liquid type liquid elastomer may be used as the raw material. Besides, other raw materials such as a liquid fluorine elastomer and a liquid acrylic elastomer may be used. Further, a thermoplastic elastomer raw material may be used other than the thermosetting elastomer raw material.

According to the LIM molding as stated above, there is provided a suppression member such as a pin in the metal die to prevent that the extensible pattern parts 31 are positionally displaced due to an injection pressure of the liquid raw material in the metal die. Besides, in the LIM molding, the covering member 40 is formed for the intermediate product C10 on each surface one by one. However, the covering members 40 may be simultaneously formed for the intermediate product C10 on both surfaces.

The LIM molding as stated above is performed, and thereby, the extensible flexible printed circuit board 10 including the covering member 40 is formed. Note that the covering member 40 may be formed by using other methods such as a transfer molding and a compression molding without performing the LIM molding being one kind of the injection molding using the elastomer raw material.

Here, as illustrated in FIG. 3, the covering member 40b enters into each of the punched parts 34 at the extensible conductive part 30 after the LIM molding. It is thereby possible to finely suppress that the extensible pattern parts 31 deform to be three dimensionally twisted. However, the FPC base material 50A and the FPC base material 50B are in contact or closely facing under a state with a very narrow gap at the extensible conductive part 30. Accordingly, the liquid elastomer raw material seldom flows into the punched part 71 even though the LIM molding is performed. Thereby, the FPC base material 50A and the FPC base material 50B are movable with each other, and the deformation of the extensible conductive part 30 is further easily performed.

<Regarding Effects>

According to the extensible flexible printed circuit board 10 having the configuration as above, the following effects are produced.

Namely, it is difficult to make the conductive layers multilayer even if extensibility is possessed at a current part corresponding to the extensible conductive part. This is because a method in which a conductive part is formed at a base material such as the elastomer is employed in the current extensible conductive part, and when the conductive layer is multilayered, it is necessary to further stack the elastomer on the formed conductive layer, and a conductive layer is formed again on the stacked elastomer, and so on. Besides, even when the conductive layer is formed at the base material such as the elastomer and the conductive layer is multilayered, there is a possibility that any of the multilayered conductive layers is broken resulting from extension of the base material such as the elastomer.

However, in the extensible flexible printed circuit board 10 according to the present embodiment, one or a plurality of flexible printed circuit boards (the FPC base materials 50) each having a plurality of conductive layers 52, 53 and the insulating layer such as the base material 51 are set to be the base circuit board 12, and the extensible conductive part 30 is provided at least at a part of the base circuit board 12. Accordingly, the multilayering of the conductive layers (the conductive layers 52, 53) is made possible while securing the extensibility at the extensible conductive part 30 according to the present embodiment. In addition, the FPC base material 50 is set to be the base circuit board 12, and the conductive layers 52, 53 are stacked at a part of the base circuit board 12 where it is difficult to extend/contract such as the base material 51, and therefore, a configuration where the conductive layers 52, 53 are difficult to be broken is enabled compared to the case when the elastomer or the like is made to be the base material.

Besides, the flexible printed circuit board (FPC base material 50) is set to be the base circuit board 12 to form the extensible conductive part 30. Therefore, it is not necessary to form an additional wiring pattern which is different from the FPC base material 50 at the base material made of the elastomer to form a part which corresponds to the extensible conductive part. When the additional wiring pattern is formed, the photofabrication method is additionally performed for the base material made of the elastomer, but in the extensible conductive part 30 of the present embodiment, the above-stated step is not necessary. It is therefore possible to reduce the number of steps to form the extensible conductive part 30.

Besides, the extensible conductive part 30 is covered with the covering member 40 (the covering member 40b) with flexibility. Therefore, it is possible for the extensible conductive part 30 to possess the waterproof property and the dustproof property while securing the flexibility.

Further, in the present embodiment, the extensible conductive part 30 is covered with the covering member 40 (the covering member 40b) with flexibility, and thereby, it is possible to prevent that behavior of the extensible pattern part 31 at the extension/contraction time becomes unstable. Namely, if the covering member 40b does not exist, the extensible pattern part 31 not only deforms at an XY plane but also tends to deform in a Z direction so as to stand up (to twist) when the extensible pattern part 31 extends. However, the covering member 40b covers the extensible pattern part 31, and thereby, it is possible to prevent the deformation of standing up (of twisting), and to stabilize the behavior of the extensible pattern part 31 at the extension/contraction time.

Besides, in the present embodiment, the extensible conductive part 30 capable of mounting the electronic components 22 is provided at least at a part of the base circuit board 12. Therefore, the mounting of the electronic components 22 can also be easily performed. Besides, in the present embodiment, the FPC base material 50 is set to be the base circuit board 12, and stacking is performed at the part difficult to extend/contract such as the base material 51 at the base circuit board 12. Therefore, it is possible to prevent that the electronic components 22 are broken by the deformation such as the extension. In addition, at least the electronic components 22 of the component mounting part 20 are covered with the covering member 40a, and thereby, it becomes possible to protect the electronic components 22 from moisture, water, dust, and the like. Besides, it is also possible to protect the electronic components 22 from impact.

Besides, in the present embodiment, the extensible flexible printed circuit board 10 is able to mount the electronic components 22 thereon, and the conductive layers 52, 53 are multilayered. This easily realizes a wearable electronic device where the electronic components 22 are mounted on the extensible flexible printed circuit board 10. In particular, the extensible conductive part 30 is easy to deform, and therefore, it is possible to attach the extensible flexible printed circuit board 10 at a bendable part such as a joint of a human body.

Besides, in the present embodiment, the extensible pattern part 31 includes the joint part 31a and the curved part 31b, and it is possible to exhibit the extensibility by the curved part 31b curving to open or close. Here, when the curved part 31b opens or closes, defects such as wire breakage are easy to occur in a vicinity of the curved part 31b because a large stress is applied to the curved part 31b. However, in the present embodiment, the extensible pattern parts 31 are covered with the covering member 40b. Accordingly, it is possible to suppress development of cracks owing to the covering member 40b if minute cracks or the like occur at the curved part 31b. It is thereby possible to prevent that the wire breakage occurs in the vicinity of the curved part 31b where the stress is applied.

Besides, when the covering member 40b does not exist, the defects such as the wire breakage are apt to occur at the curved parts 31b or the like caused by too much extension of the extensible conductive part 30. However, the extensible pattern parts 31 are covered with the covering member 40b, and thereby, it is possible to prevent the extensible conductive part 30 from excessive extension. It is thereby possible to prevent that the defects such as the wire breakage occurs at the curved part 31b or the like.

Besides, in the present embodiment, the base circuit board 12 includes a plurality of FPC base materials 50, for example, two FPC base materials 50. In addition, the adjacent FPC base materials 50 are disposed to face with each other under a state where the adhesive layer does not intervene between the plurality of FPC base materials 50 (a state where the punched part 71 exists) at the extensible conductive part 30. In general, the adhesive layer often results in the hardest part in the flexible printed circuit board, and the deformations such as various extension/contraction and twisting like the extension/contraction, bending and twisting of the extensible conductive part 30 are difficult to occur when the adhesive layer exists. However, there is not the adhesive layer but the punched part 71 between the adjacent FPC base materials 50 in the extensible conductive part 30. Accordingly, it is possible to prevent that the deformations are inhibited such as the case when the adhesive layer exists.

Besides, the FPC base material 50A and the FPC base material 50B are in contact or closely facing under the state with the very narrow gap at the extensible conductive part 30. Therefore, the liquid elastomer raw material seldom flows into the punched part 71 when the LIM molding is performed. Thereby, the FPC base material 50A and the FPC base material 50B are movable with each other, and the deformation of the extensible conductive part 30 is further performed.

Further, in the present embodiment, the arc angle of the curved part 31b is provided to be 180 degrees or less under the state where the external force is not applied. Here, when the arc angle of the curved part 31b exceeds 180 degrees and the curved part 31b is the horseshoe shape, the punched parts 34 each with a narrow interval are formed between the adjacent joint part 31a and the curved part 31b at the covering member 40b which covers the extensible pattern parts 31. Accordingly, the width of the covering member 40b which enters into the punched part 34 is also narrow, and therefore, it is hard to deform them even when the adjacent joint part 31a and the curved part 31b are forced to be deformed open (to extend). However, in the present embodiment, the arc angle of the curved part 31b is provided to be 180 degrees or less than 180 degrees under the state where the external force is not applied to the extensible conductive part 30. Therefore, the difficulty in deformation as stated above can be prevented, and the deformations such as the extension/contraction of the extensible conductive part 30 can be finely performed.

Besides, in the present embodiment, the plurality of extensible pattern parts 31 are formed at the extensible conductive part 30 by the laser machining. It is therefore possible to make the spot diameter of the laser beam small by adjustment or the like of the optical elements. Accordingly, the high-precision machining of the extensible pattern parts 31 becomes possible.

Further, in the present embodiment, at least one of the thicknesses between the front surface side and the rear surface side of the covering member 40 is provided such that the covering member 40b becomes thinner than the covering member 40a. It is thereby possible to make the extensibility at the extensible conductive part 30 good.

Further, in the present embodiment, the covering member 40 is formed by the injection molding of the liquid elastomer raw material. When the LIM molding as stated above is performed, it is possible to cover a periphery of the electronic components 22 with no gap. It is thereby possible to finely protect the electronic components 22 from moisture, water, dust, and the like.

Modified Example

Although one embodiment of the present invention is described as above, the present invention can be modified in various ways other than the above. This will be described below.

Figure 15:
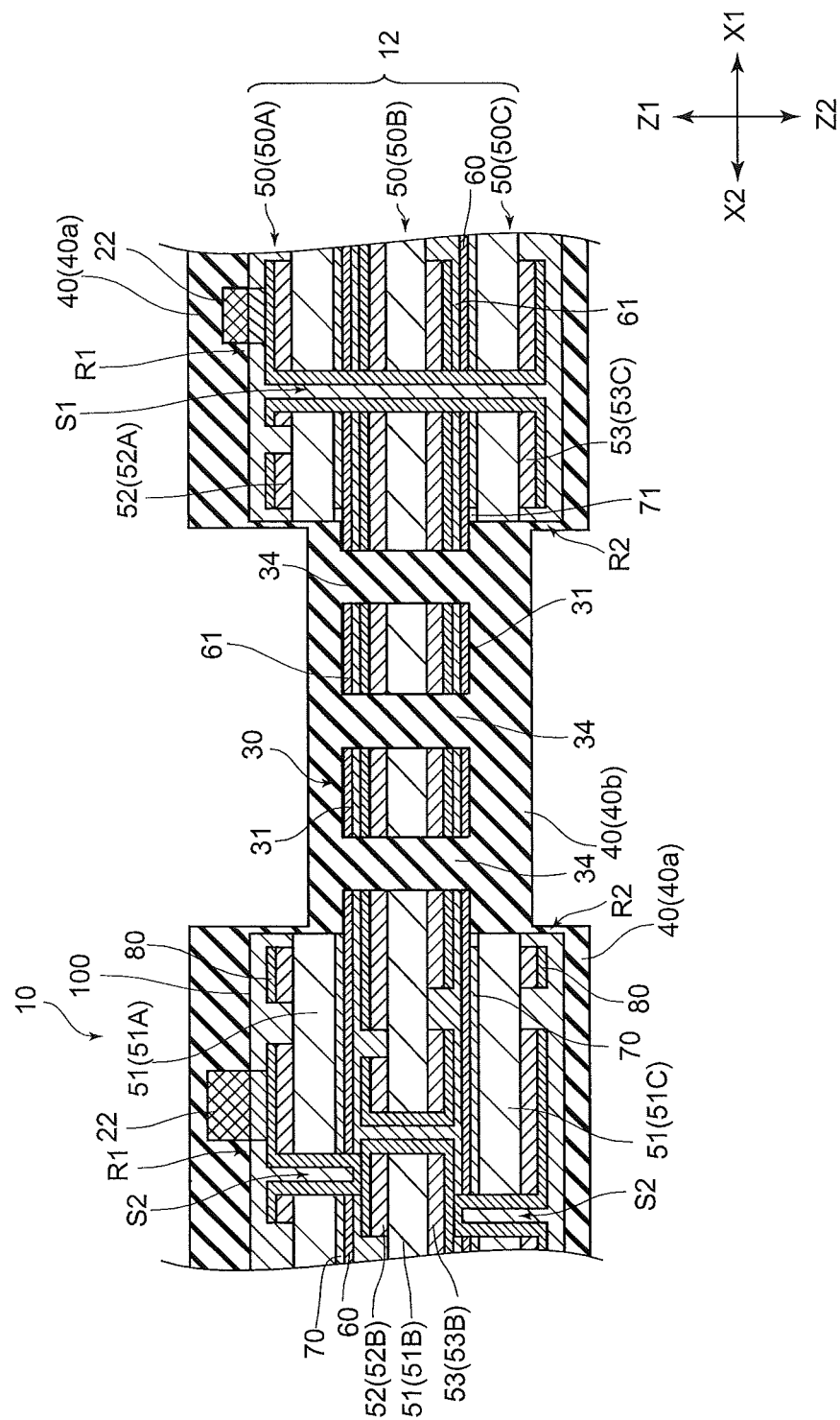
FIG. 15 is a sectional side view according to another embodiment of the present invention, and illustrating a configuration of the extensible flexible printed circuit board.

FIG. 15 is another embodiment of the present invention. In FIG. 3, the base circuit board 12 is made up of the two FPC base materials 50A, 50B, and has a structure with two one-sided layers of the conductive layers (the conductive layers 53A, 52B) separated at the extensible conductive part 30. However, as illustrated in FIG. 15, the base circuit board 12 may be made up of three FPC base materials 50A, 50B, and 50C. Note that in the configuration illustrated in FIG. 15, the FPC base material 50A includes the base material 51A and the conductive layer 52A, the FPC base material 50B includes the base material 51B and the conductive layers 52B, 53B, and further, the FPC base material 50C includes a base material 51C and a conductive layer 53C.

In the configuration illustrated in FIG. 15, the conductive layers of the extensible conductive part 30 are the conductive layers 52B, 53B of the FPC base material 50B, and the two layers of the conductive layers 52B, 53B are included at both surfaces of the base material 51B. There are included a total of four layers where each one layer (the conductive layers 52A, 53C) at front and rear in addition to the two layers (the conductive layers 52B, 53B) at the component mounting part 20. The structure with two one-sided layers of the conductive layers separated at the extensible conductive part 30 as illustrated in FIG. 3 is excellent in the extensibility and bendability because the displacement with each other is allowed. On the other hand, there is an advantage in the double-sided conductive layers (the configuration where the conductive layers 52B, 53B exist at both surfaces of the base material 51B) as illustrated in FIG. 15 that it is easy to perform an impedance control because distances and positions of the conductive layers with each other are fixed.

Besides, in the above-stated embodiment, the component mounting parts 20 and the extensible conductive part 30 are covered with the same covering member 40. However, for example, tape members each including the waterproof property and the flexibility formed by the elastomer such as an urethane elastomer may be respectively adhered on the front surface side and the rear surface side of the extensible conductive part 30. It is also possible to prevent the cracks at the curved part 31b or the like of the extensible conductive part 30 by forming as stated above. Besides, it is possible to prevent the extensible conductive part 30 from excessive extension. A covering member of the component mounting part 20 may be formed by the injection molding of the liquid elastomer raw material, or formed by the injection molding of a liquid plastic raw material because there is no necessity in the extension/contraction. In this case, it is preferable from a viewpoint of the waterproof property that the elastomer or plastic raw material is injected to be molded so as to cover a part of an edge of the component mounting part 20 with the tape member covering the extensible conductive part 30.

Besides, in the above-stated embodiment, the extensible flexible printed circuit board 10 where only one extensible conductive part 30 exists is disclosed. However, a plurality of extensible conductive parts 30 may exist. Besides, in the above-stated embodiment, the component mounting parts 20 exist at both end sides of the extensible flexible printed circuit board 10. However, the component mounting parts 20 may be provided at a middle part in the longitudinal direction or the like of the extensible flexible printed circuit board 10.

For example, a configuration in which the extensible conductive parts 30 are respectively provided at both end sides in the X direction of the component mounting parts 20 may be employed.

Besides, in the above-described embodiment, one in which the arc angle of the curved part 31b is set to 180 degrees is illustrated. However, the arc angle of the curved part 31b may be smaller than 180 degrees.

The invention claimed is:

1. An extensible flexible printed circuit board having extensibility, comprising:
 a plurality of flexible printed circuit boards, the plurality of flexible printed circuit boards being arranged at least a surface of each of the plurality of flexible circuit boards face a surface of another of the plurality of flexible printed circuit boards; and a covering member whose material is a flexibly deformable elastomer, and which covers the plurality of flexible printed circuit boards;

wherein at least one of the plurality of flexible printed circuit boards comprises a component mounting part structured so as to receive electronic components mounted thereon;

wherein each of the plurality of flexible printed circuit boards comprises an extensible conductive part, the extensible conductive part comprising:

an extensible pattern part comprising a plurality of joint parts each intersecting a center line when an extension/contraction direction is set to the center line, and a plurality of curved parts each continuing from an end part of the joint part, and proceeding from the joint part to return to the center line side, and exhibiting extensibility by the curved parts bending to open or close; and a portion other than the extensible pattern part;

wherein an insulating layer is provided between adjacent flexible printed circuit boards of the plurality of flexible circuit boards, the insulating layer comprising an adhesive layer at a region corresponding to the component mounting part, and the insulating layer does not include an adhesive layer at a portion corresponding to the extensible conductive part;

wherein the covering member penetrates through the plurality of flexible printed circuit boards at the portion other than the extensible pattern part.

2. The extensible flexible printed circuit board according to claim 1, wherein an arc angle of the curved part is provided to be 180 degrees or less under a state where an external force is not applied, and, the curved part is provided in a bellows state by alternately switching a direction of the curve.

3. The extensible flexible printed circuit board according to claim 1, wherein a plurality of extensible pattern parts are formed at the extensible conductive part by laser machining.

4. The extensible flexible printed circuit board according to claim 1, wherein at least one of thicknesses of a front surface side and a rear surface side of the covering member is provided such that a portion covering the component mounting part is thicker than a portion covering the extensible conductive part.

5. The extensible flexible printed circuit board according to claim 1, wherein the covering member is formed by injection molding of a liquid elastomer raw material.

* * * * *